US007577874B2

(12) United States Patent
Jones et al.

(10) Patent No.: US 7,577,874 B2
(45) Date of Patent: Aug. 18, 2009

(54) INTERACTIVE DEBUG SYSTEM FOR MULTIPROCESSOR ARRAY

(75) Inventors: Anthony Mark Jones, Beaverton, OR (US); Paul M. Wasson, Beaverton, OR (US); Edmund H. White, Beaverton, OR (US)

(73) Assignee: Nethra Imaging, Inc., Santa Clara, CA (US)

( * ) Notice: Subject to any disclaimer, the term of this patent is extended or adjusted under 35 U.S.C. 154(b) by 5 days.

(21) Appl. No.: 11/673,986

(22) Filed: Feb. 12, 2007

(65) Prior Publication Data

US 2007/0180323 A1    Aug. 2, 2007

Related U.S. Application Data

(63) Continuation-in-part of application No. 10/871,347, filed on Jun. 18, 2004.

(60) Provisional application No. 60/850,078, filed on Oct. 8, 2006, provisional application No. 60/839,036, filed on Aug. 20, 2006, provisional application No. 60/790,912, filed on Apr. 10, 2006, provisional application No. 60/479,759, filed on Jun. 18, 2003.

(51) Int. Cl.
*G06F 11/00* (2006.01)

(52) U.S. Cl. .......................... 714/31; 714/30

(58) Field of Classification Search .................... 714/31
See application file for complete search history.

(56) References Cited

U.S. PATENT DOCUMENTS

| 6,115,763 | A  | * | 9/2000  | Douskey et al. ............... 710/72  |
| 6,857,084 | B1 | * | 2/2005  | Giles ........................... 714/35  |
| 7,007,201 | B1 | * | 2/2006  | Byrne et al. ................... 714/27  |
| 7,016,826 | B2 |   | 3/2006  | Wheeler et al.  |
| 7,047,348 | B2 |   | 5/2006  | Wu  |
| 7,080,283 | B1 | * | 7/2006  | Songer et al. .................. 714/30  |
| 7,152,186 | B2 | * | 12/2006 | Airaud et al. .................. 714/30  |
| 7,328,375 | B2 | * | 2/2008  | Gupta et al. ................... 714/45  |
| 2004/0117770 | A1 | * | 6/2004 | Swoboda et al. ............ 717/128  |

* cited by examiner

*Primary Examiner*—Yolanda L Wilson
(74) *Attorney, Agent, or Firm*—Marger Johnson & McCollom, P.C.

(57) ABSTRACT

A debug network on a multiprocessor array includes communication channels, a master controller, and one or more individual debug units in communication with one or more of the processors. The master controller solicits information from the debug units by sending messages along the communication channels. The debug units can control some aspects of the processors, and can simply report on other aspects. By using commands to invoke processor action, then accessing the result, interactive debugging of a multiprocessor array is possible.

34 Claims, 9 Drawing Sheets

FIG. 9

INTERACTIVE DEBUG SYSTEM FOR MULTIPROCESSOR ARRAY

CROSS REFERENCE TO RELATED APPLICATIONS

This application is a continuation-in-part of co-pending U.S. application Ser. No. 10/871,347, filed Jun. 18, 2004, entitled DATA INTERFACE FOR HARDWARE OBJECTS, which in turn claims the benefit of U.S. provisional application 60/479,759, filed Jun. 18, 2003, entitled INTEGRATED CIRCUIT DEVELOPMENT SYSTEM. Additionally this application claims the benefit of U.S. provisional application 60/790,912, filed Apr. 10, 2006, entitled MIMD COMPUTING FABRIC, and of U.S. provisional application 60/839,036, filed Aug. 20, 2006, entitled RECONFIGURABLE PROCESSOR ARRAY, and of U.S. provisional application 60/850,078, filed Oct. 8, 2006, entitled RECONFIGURABLE PROCESSOR ARRAY AND DEBUG NETWORK. The teachings of all of these applications are explicitly incorporated by reference herein.

TECHNICAL FIELD

This disclosure relates to a system debugger, and, more particularly, to a system debugger structured to operate on a multiprocessor platform.

BACKGROUND

Debugging software that executes on hardware systems is the process of recognizing, identifying and fixing or isolating software and/or hardware errors. An error occurs when an actual result does not match an expected result, and can be caused by errors in the software and/or hardware.

Developing software applications for a new computer processor typically uses a software simulation of the new processor design, where software being developed is run on the software model of the chip being developed.

Debugging mixed software/hardware systems is easier if either the software or the hardware has been verified as accurate in another system. Debugging mixed software/hardware systems where neither has been verified to be accurate is difficult and this difficulty scales as the number of interrelated processes increases.

The difficulty of debugging a software/hardware system that is based on an architecture of dozens or hundreds of individual processors does not scale linearly from experience in single processor systems. Not only must the operation of each processor be verified, but communication paths and buffers between the processors must be exposed for analysis. No tool currently exists that provides the type of exposure, depth, and flexibility necessary to adequately debug such multi-processor systems.

Embodiments of the invention address these and other limitations in the prior art.

DETAILED DESCRIPTION

Figure 1:
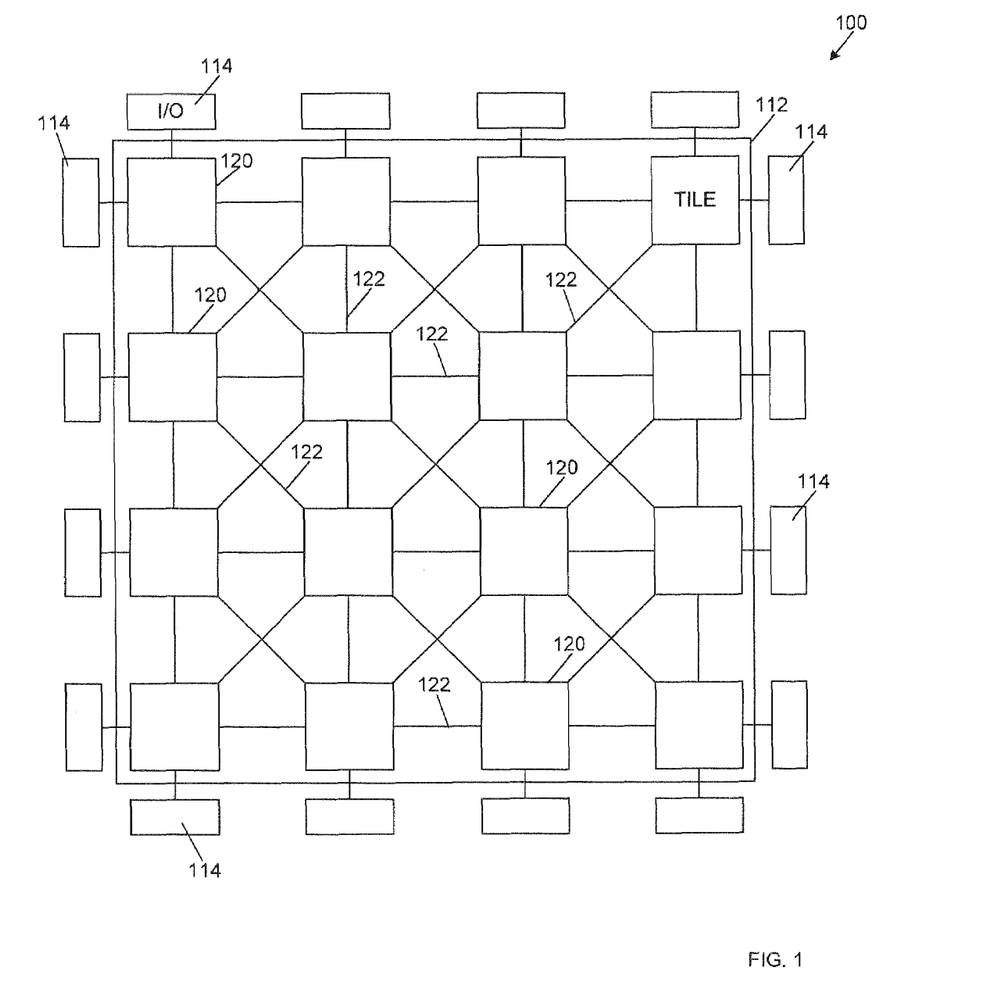
FIG. 1 is a block diagram of an integrated circuit platform formed of a central collection of tessellated operating units surrounded by I/O circuitry according to embodiments of the invention.

FIG. 1 illustrates an example tessellated multi-element processor platform 100 according to embodiments of the invention, Central to the processor platform 100 is a core 112 of multiple tiles 120 that are arranged and placed according to available space and size of the core 112. The tiles 120 are interconnected by communication data lines 122 that can include protocol registers as described below.

Additionally, the platform 100 includes Input/Output (I/O) blocks 114 placed around the periphery of the platform 100. The I/O 114 blocks are coupled to some of the tiles 120 and provide communication paths between the tiles 120 and elements outside of the platform 100. Although the I/O blocks 114 are illustrated as being around the periphery of the platform 100, in practice the blocks 114 may be placed anywhere within the platform 100. Standard communication protocols, such as Periphery Component Interface Express (PCIe), Dynamic Data Rate Two Synchronous Dynamic Random Access Memory interface (DDR2), or simple hardwired input/output wires, for instance, could be connected to the platform 100 by including particularized I/O blocks 114 structured to perform the particular protocols required to connect to other devices.

The number and placement of tiles 120 may be dictated by the size and shape of the core 112, as well as external factors, such as cost. Although only sixteen tiles 120 are illustrated in FIG. 1, the actual number of tiles placed within the platform 100 may change depending on multiple factors. For instance, as process technologies scale smaller, more tiles 120 may fit within the core 112. In some instances, the number of tiles 120 may be purposely be kept small to reduce the overall cost of the platform 100, or to scale the computing power of the platform 100 to desired applications. In addition, although the tiles 120 are illustrated as being equal in number in the horizontal and vertical directions, yielding a square platform 100, there may be more tiles in one direction than another, and may be shaped to accommodate additional, non tiled elements. Thus, platforms 100 with any number of tiles 120, even one, in any geometrical configuration are specifically contemplated. Further, although only one type of tile 120 is illustrated in FIG. 1, different types and numbers of tiles may be integrated within a single processor platform 100.

Tiles 120 may be homogenous or heterogeneous. In some instances the tiles 120 may include different components. They may be identical copies of one another or they may include the same components packed differently.

Figure 2:
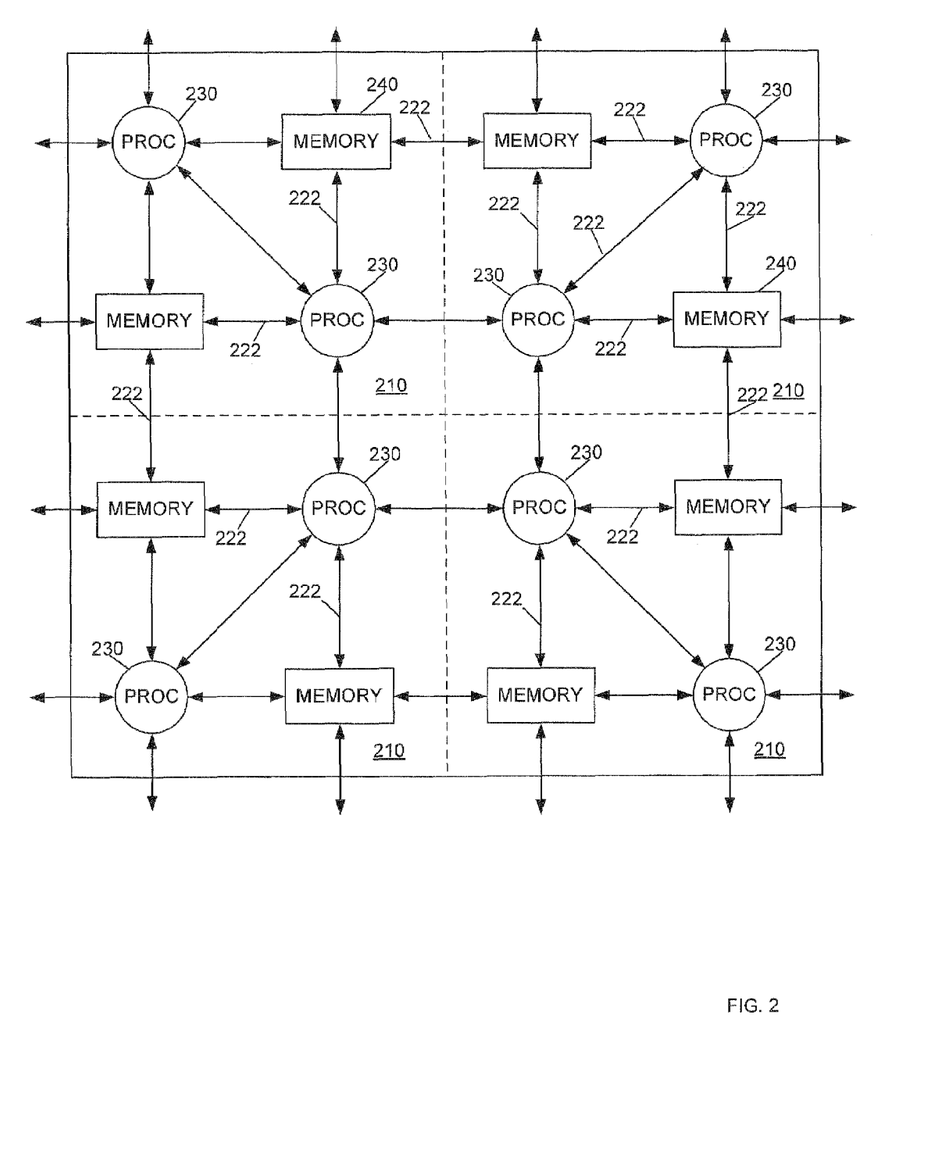
FIG. 2 is a block diagram illustrating several groups of processing units used to make the operating units of FIG. 2 according to embodiments of the invention.

FIG. 2 illustrates components of example tiles 210 of the platform 100 illustrated in FIG. 1. In this figure, four tiles 210 are illustrated. The components illustrated in FIG. 2 could also be thought of as one, two, four, or eight tiles 120, each having a different number of processor-memory pairs. For the remainder of this document, however, a tile will be referred to as illustrated by the delineation in FIG. 2, having two processor-memory pairs. In the system described, there are two types of tiles illustrated, one with processors in the upper-left and lower-right corners, and another with processors in the upper-right and lower-left corners. Other embodiments call include different component types, as well as different number of components. Additionally, as described below, there is no requirement that the number of processors equal the number of memory units in each tile 210.

Figure 4:
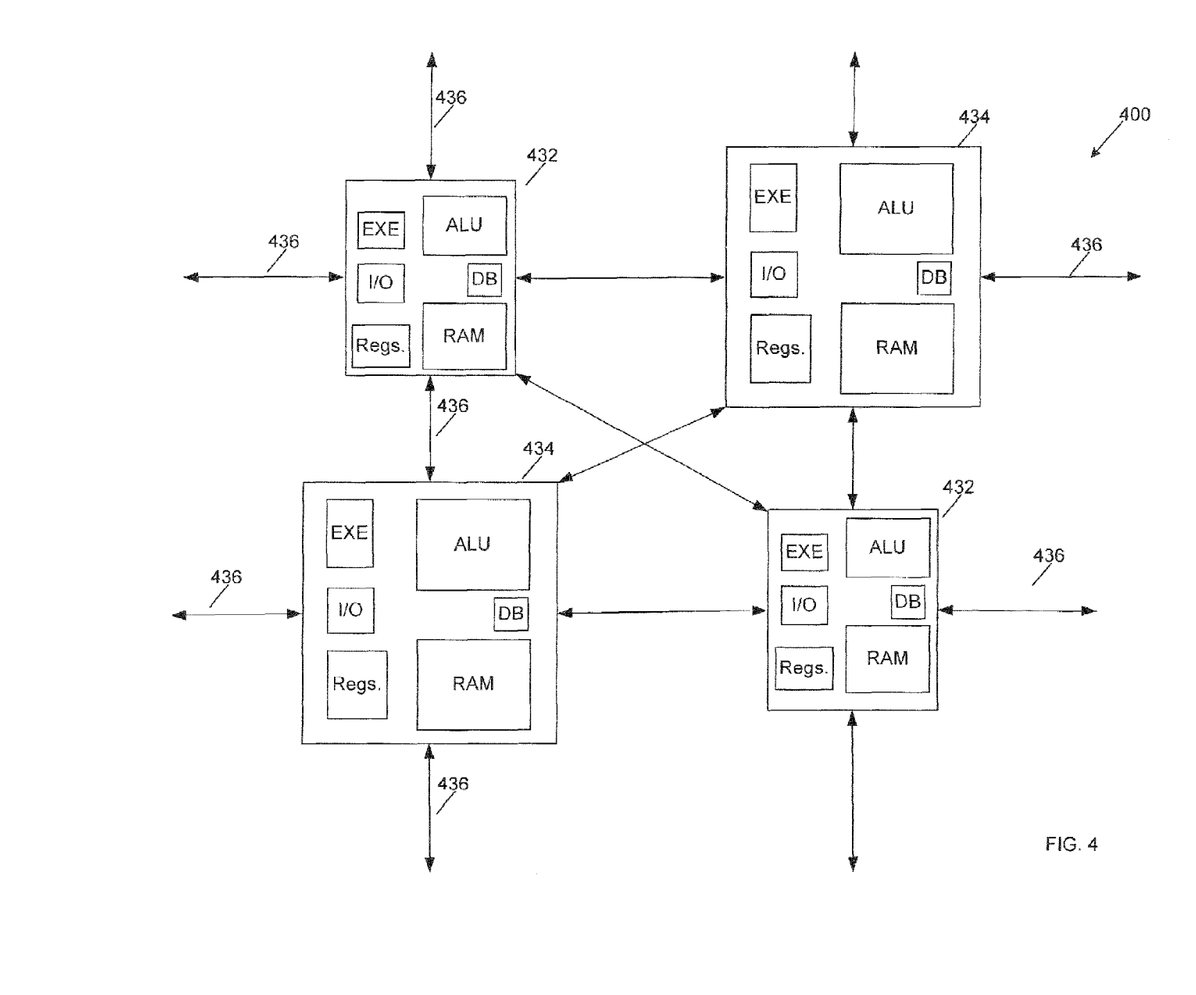
FIG. 4 is a block diagram of details of an example compute unit illustrated in FIG. 2 according to embodiments of the invention.

In FIG. 2, an example tile 210 includes processor or "compute" units 230 and "memory" units 240. The compute units 230 include mostly computing resources, while the memory units 240 include mostly memory resources. There may be, however, some memory components within the compute unit 230 and some computing components within the memory unit 240. In this configuration, each compute unit 230 is directly attached to one memory unit 240, although it is possible for any compute unit to communicate with any memory unit within the platform 100 (FIG. 1).

Data communication lines 222 connect units 230, 240 to each other as well as to units in other tiles. Detailed description of components with the compute units 230 and memory units 240 begins with FIG. 4 below.

Figure 3:
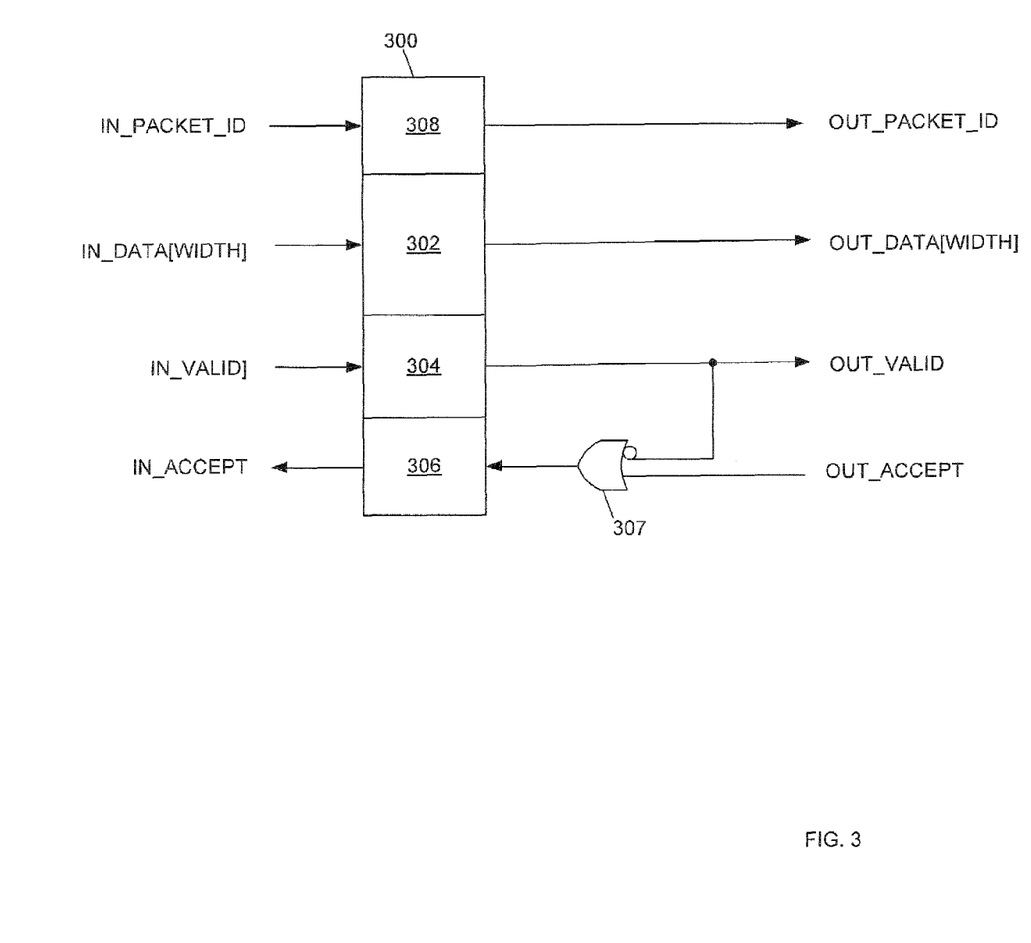
FIG. 3 is a block diagram of a data/protocol register used to connect various components within and between the processing units of FIG. 3.

FIG. 3 is a block diagram illustrating a data/protocol register 300, the function and operation of which is described in U.S. application Ser. No. 10/871,347 referred to above. The register 300 includes a set of storage elements between an input interface and an output interface.

The input interface uses an accept/valid data pair to control the flow of data. If the valid and accept signals are both asserted, the register 300 moves data stored in sections 302 and 308 to the output datapath, and new data is stored in 302, 308. Further, if out_valid is de-asserted, the register 300 continues to accept new data while overwriting the invalid data in 302, 308. This push-pull protocol register 300 is locally self-synchronizing in that it only moves data if the data is valid and the subsequent register is ready to accept it. Likewise, if the protocol register 300 is not ready to take data, it de-asserts the in_accept signal, which informs the previous stages that the register 300 cannot take the next data value.

In some embodiments, the packet_id value stored in the section 308 is a single bit and operates to indicate that the data stored in the section 302 is in a particular packet, group or word of data. In a particular embodiment, a LOW value of the packet_id indicates that it is the last word in a message packet. All other words in the packet would have a HIGH value for packet_id. Thus the first word in a message packet can be determined by detecting a HIGH packet_id value that immediately follows a LOW value for the word that precedes the current word. Alternatively stated, the first HIGH value for the packet_id that follows a LOW value for a preceding packet_id indicates the first word in a message packet.

The width of the data storage section 302 can vary based on implementation requirements. Typical widths would include powers of two such as 4, 8, 16, and 32 bits.

With reference to FIG. 2, the data communication lines 222 could include a register 300 at each end of each of the communication lines. Because of the local self-synchronizing nature of register 300, additional registers 300 could be inserted anywhere along the communication lines without changing the operation of the communication.

FIG. 4 illustrates a set of example elements forming an illustrative compute unit 400 which could be the same or similar to the compute unit 230 of FIG. 2. In this example, there are two minor processors 432 and two major processors 434. The major processors 434 have a richer instruction set and include more local storage than the minor processors 432, and are structured to perform mathematically intensive computations. The minor processors 432 are more simple compute units than the major processors 434, and are structured to prepare instructions and data so that the major processors can operate efficiently and expediently.

In detail, each of the processors 432, 434 may include an execution unit, an Arithmetic Logic Unit (ALU), a set of Input/Output circuitry, and a set of registers. In an example embodiment, the registers of the minor processors 432 may total 64 words of instruction memory while the major processors include 256 words, for instance. Additionally, a debug unit (DB) may be instanced in each of the processors 432, 434.

Communication channels 436 may be the same or similar to the data communication lines 222 of FIG. 2, which may include the data registers 300 of FIG. 3.

Figure 5:
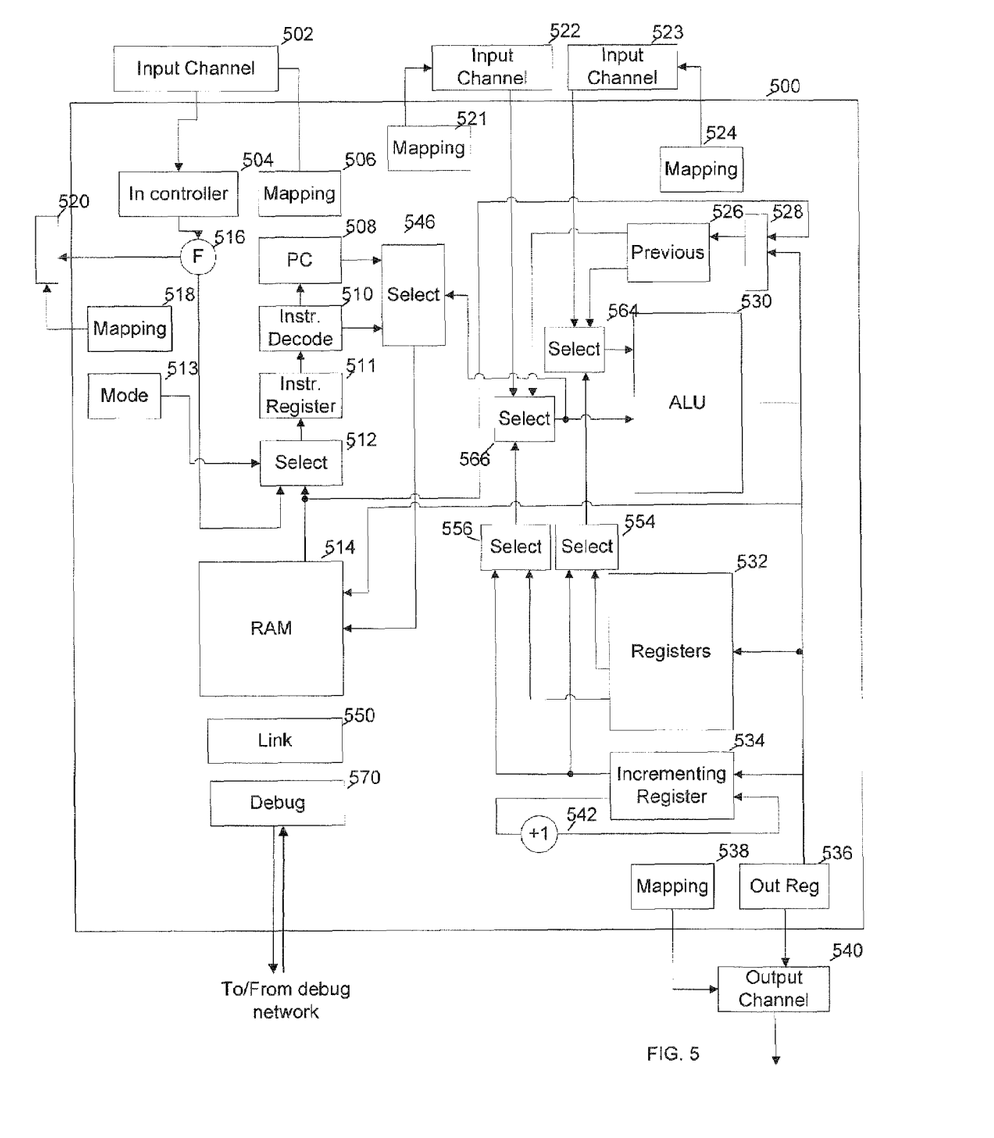
FIG. 5 is a block diagram of an example processor included in the compute unit of FIG. 4.

FIG. 5 illustrates an example processor 500 that could be an implementation of either the minor processor 432 or major processor 434 of FIG. 4.

Major components of the example processor 500 include input channels 502, 522, 523, output channels 520, 540, an ALU 530, registers 532, internal RAM 514, and an instruction decoder 510. The ALU 530 contains functions such as an adder, logical functions, and a multiplexer. The RAM 514 is a local memory that can contain any mixture of instructions and data. Instructions may be 16 or 32 bits wide, for instance.

The processor 500 has two execution modes: Execute-From-Channel (channel execution) and Execute-From-Memory (memory execution), as described in the U.S. application 60/836,036 referred to above.

In memory execution mode, the processor 500 fetches instructions from the RAM 514, decodes them in the decoder 510, and executes them in a conventional manner by the ALU 530 or other hardware in the processor 500. In channel execution mode, the processor 500 operates on instructions sent to the processor 500 over an input channel 502. A selector 512 determines the source of the instructions for the processor 500 under control of a mode register 513. A map register 506 allows any physically connected channel to be used as the input channel 502. By using a logical name for the channel 502 stored in the map register 506, the same code can be used independent of the physical connections.

Numeric operations are performed in the ALU 530, and can be stored in any of a set of registers 532. One or two operands may be sent to the ALU 530 from the selectors 564 and 566. Specialized registers include a self-incrementing register 534, which is useful for counting, and a previous register 526, which holds the output from the previous ALU 530 computation.

Input channels 522, 523 supply data and/or instructions for the processor 500.

A debug slave 570 is an independently operating unit that may be included in each processor and memory of the entire system 100, including the core 112 and I/Os 114 (FIG. 1). Including an interactive debug network on the system 100 allows software to thoroughly examine and test the hardware as it runs. Detailed description of the debug slave 570 and how it relates to an entire debug system follows.

Figure 6:
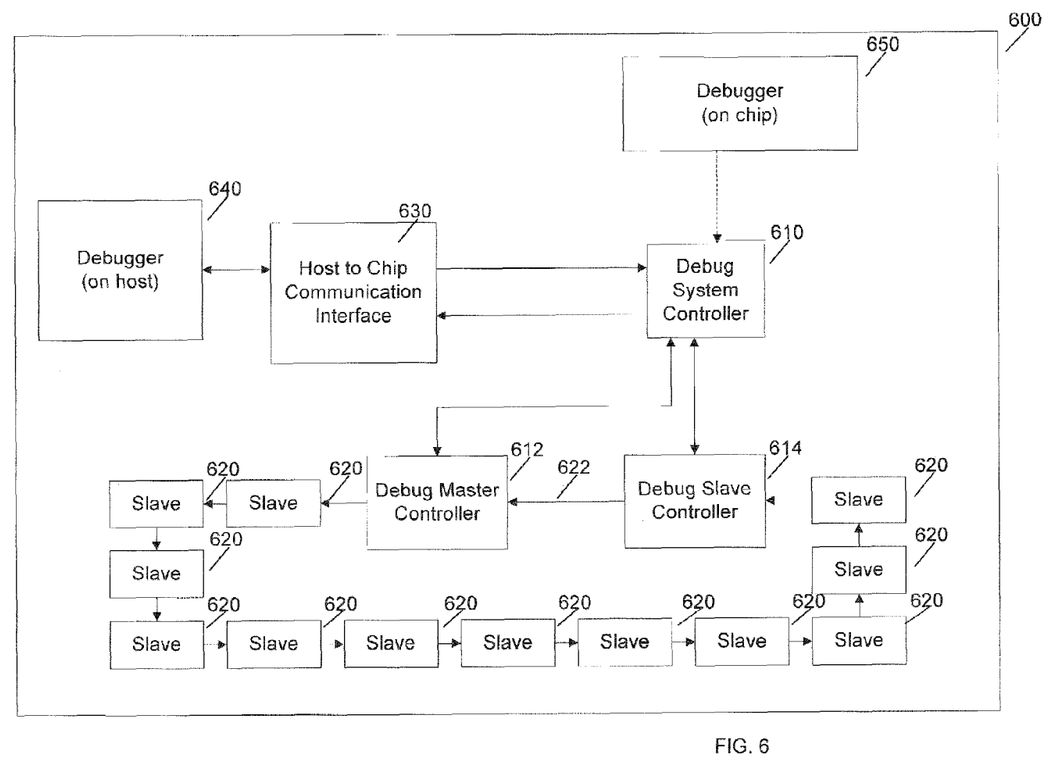
FIG. 6 is a functional block diagram of an example debug system implementing a debug network according to embodiments of the invention.

FIG. 6 illustrates a debug system 600 according to embodiments of the invention. The debug network includes a debug system controller 610, which directly controls a debug master controller 612 and communicates with a debug slave controller 614.

A debug datapath 622, or debug network, as referenced in FIG. 5, connects through a series of slaves 620 to form a ring. In one embodiment, the datapath 622 is formed of data/protocol registers 300 illustrated in FIG. 3. In the embodiment described with reference to FIG. 6, the width of the data register 302 can be a single data bit. Additionally, the valid, accept, and packet_id registers 304, 306, 308, can also be a single bit wide. Thus, in this example, the datapath 622 is four bits wide. The master controller 612 and slave controller 614 control the valid and accept signals for the datapath 622 as described with reference to FIG. 3 above. By controlling these valid and accept signals, data is sent around the datapath 622 in a predetermined manner. In an example embodiment, the entire datapath 622 is formed of a single shift register, where the output of one slave 620 is bitwise shifted to the next location in the datapath. Each slave 620 is identified with a particular bit location in the shift register. By stepping the exact number of times as there are slaves 620 on the network 600, a data bit makes a complete circuit around the datapath 622. In the illustrated embodiment, the master controller 612 generates data to be placed on the datapath 622 and the slave controller 614 removes data from the datapath after it has completed the entire datapath 622 ring. In other embodiments, the master controller 612 performs both functions of placing data on the datapath 622 ring as well as removing data from the ring. In embodiments of the invention, the datapath 622 is a standalone datapath that no other object within the system 100 uses for any other purpose.

The slaves 620 may be resident in the processors, as illustrated in FIG. 5, block 570, or may otherwise may be connected to retrieve data from and write data to the processors. In an example embodiment, there is only one debug master controller 612 active for each datapath 622, although more than one master could be operating if desired. For example, one master controller 612 could be monitoring a particular aspect of all the slaves 620, while another master controller could be controlling the ring. In other embodiments, each system 100 could include several or even many separate datapaths 622, each under the control of at least one master controller 612. Further, in some embodiments, the datapath 622 may include dedicated portions of data communication lines 222 of FIG. 2. In addition to being resident in processors, the slaves 620 can be resident in any piece of state logic, such as a memory controller. For instance, with reference to FIG. 2, several slaves 620 (not shown) may be coupled to or resident in processors in the processor group 230, while one or more slaves may also be coupled to or resident in memory controllers in the memory group 240.

Referring back to FIG. 6, a debugger 640 resides separate from the core 112 (FIG. 1), and connects to it through a host to chip communication interface 630, which may be embodied by one of the I/Os 114 of FIG. 1. For instance, the communication interface could be embodied by a Joint Test Action Group standard, JTAG), also known as IEEE 1149.1, PCI, general I/O, or other acceptable interface as is known in the art. The debugger 640 could be a hardware and/or software process running on conventional hardware.

The debugging network 600 of FIG. 6 is straightforward to implement on a multiprocessing platform, such as the platform 100 of FIG. 1. In this embodiment, one or more processors in the core 112, such as a major or minor processor 434, 432 of FIG. 4 could operate as the system controller 610, the master controller 612, and the slave controller 614. In other embodiments, these duties could be shared across one or more processors in the platform 100. In some embodiments, each processor 432, 434 (FIG. 4) includes hardware to be the system controller 670 and the master controller 672, as well as includes a slave 676, and any of the processors could be selectively driven to perform any or all of the functions. Because this would be expensive to implement in hardware, other embodiments include selected hardware in only some of the processors, such as one or two processor in every tile 210 (FIG. 2). Partitioning the components of the debug network 600 is left to the implementation engineer.

One way to implement the debug system controller 610 is to use an operating kernel that accepts commands from the off-chip debugger 640 or on-chip debugger 650. The commands are translated into one or more debug packets according to a predetermined protocol used by the master controller 612, slaves 620, and the slave controller 614. The system controller 610 generates the debug packets and the master controller 612, and places them on the datapath 622. After one of the slaves 620 responds to the request from the debug packet, the slave controller 614 (or master controller 612) removes the packet from the datapath 622 and transfers it to the system controller 610 for further analysis and operation. In the event that no slave 620 responds, e.g., the packet comes back unchanged, the system controller 610 can determine that no slave 620 had a valid response.

In another embodiment, the debugger 640, 650 itself generates and interprets the debug packets, which would make the system controller 610 easier to implement, at the expense of a more complicated debugger.

Figure 7:
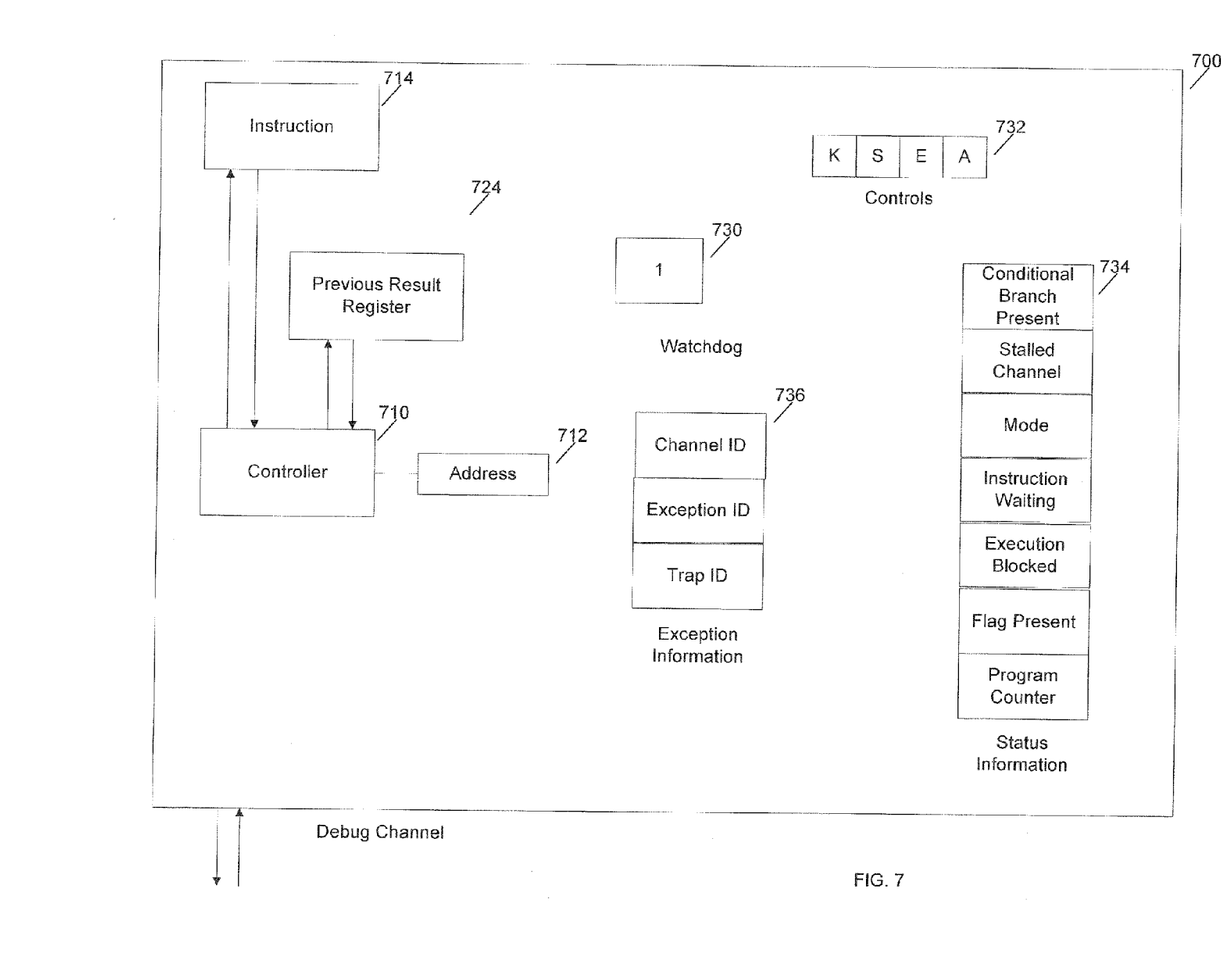
FIG. 7 is a functional block diagram of an example debug slave of FIG. 6 according to embodiments of the invention.

FIG. 7 is a functional block diagram of a slave 700, which is an example embodiment of the slave 620 of FIG. 6 or slave 570 of FIG. 5. Of course, other embodiments are possible.

The slave 700 couples to the debug network 622 (FIG. 6), referred to here as the debug channel. An address unique to each slave 700 is stored in an address register 712. A channel controller 710 accepts debug packets (described below) from the debug channel and places packets back on the channel.

An instruction register 714 may be the same as a register (not shown) exiting from the select 512 of FIG. 5. The instruction register 714 can be loaded or unloaded one bit at a time by the slave 700. Similarly, the previous result register 724 may be the same as the previous register 526 of FIG. 5. Likewise, the previous result register 724 may be loaded or unloaded, one bit at a time, by the slave 700. The single-bit operation matches the bit-wise operation of the datapath 622 of FIG. 6, so that the debug network and slaves are always synchronized.

The slave 700 also includes specialized data storage, which is used to control or read relevant data from its host processor. A watchdog bit 730 can be written by the host processor when instructed to do so. The watchdog bit 730 is initialized to zero on startup of the host processor. Executing a watchdog command in the processor writes a 1 in the watchdog bit 730. The debug network can then query the watchdog bit 730 and report it over the debug channel to the debug system controller 610. If the watchdog bit 730 contains a 1, the debug master determines that the host processor is operational, or at least has executed the watchdog command since startup or the last time it was reset. The watchdog bit 730 can also be cleared by the debug system controller 610 by sending an appropriate debug message to the particular slave 700, as described below.

A set of control data is stored in a control register 732 used by the slave 700 to control its host processor. For instance, a "keep" command is effected by storing a "1" in the K register of the control register 732. Other commands include "step"

(S), "execute" (E), and "abort" (A). These commands and their operation are described below.

A set of status information in a status register 734 provides status information about particular data and control signals on the host processor. For example, status information can include whether particular flags are asserted, if a conditional branch is present, whether any of the input or output channels of the processor have stalled, whether there is an instruction in the instruction register 714 or if the execution of the processor is blocked. Additional status information can include the mode the processor is operating in, such as memory execution or channel execution mode. A copy of the program counter (such as the program counter 508 in FIG. 5) may also kept in the status register 734.

Exception information is stored in an exception register 736. Exceptions occur when particular instructions or behavior is executed on the host processor. For example, when a trap instruction is executed by the host processor, relevant trap data is stored in a trap ID section of the exception register 736. Channel identification and exception identification can also be stored upon similar commands. Description of commands to store and use such data follows.

Figure 8:
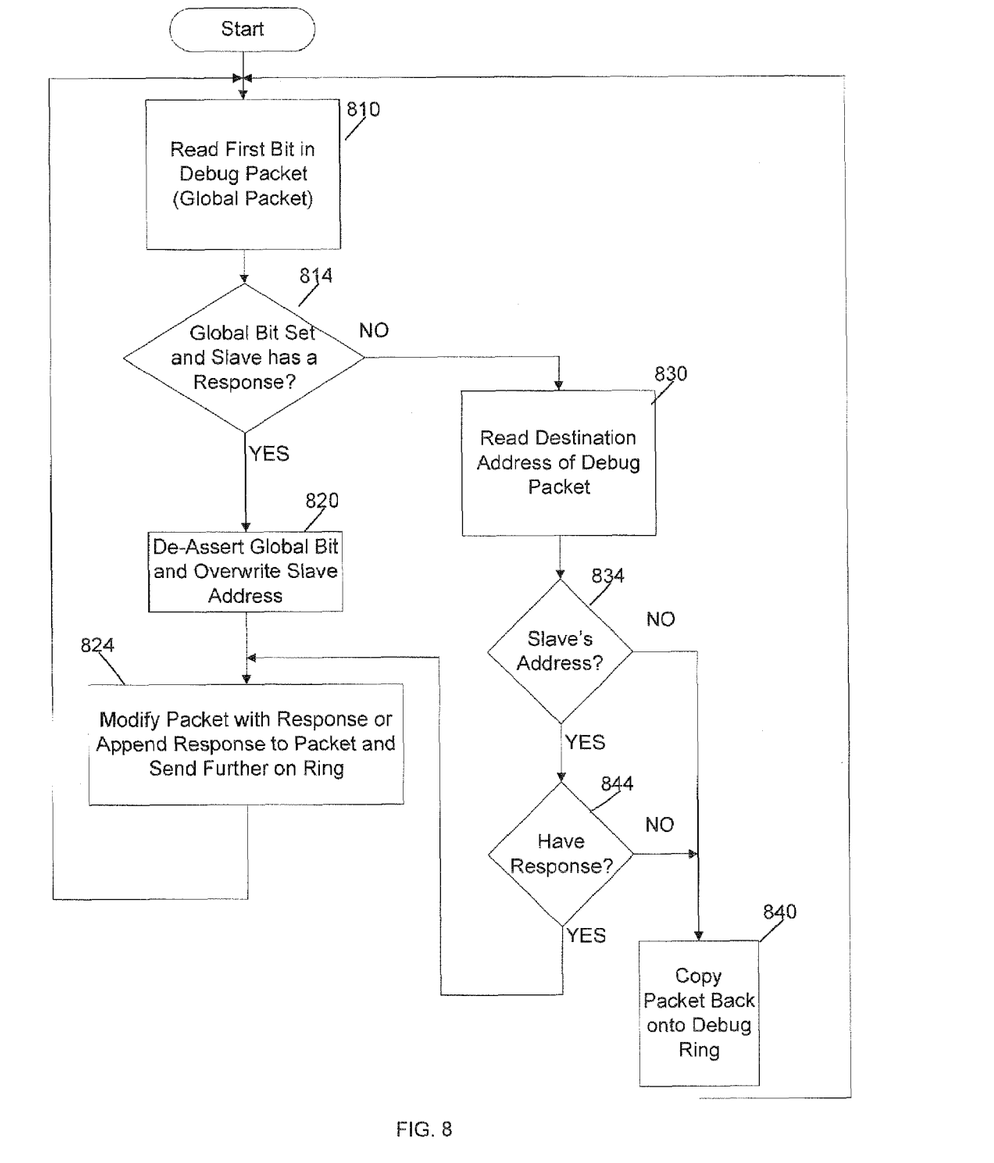
FIG. 8 is an example flow diagram illustrating operation of a debug slave of FIGS. 6 or 7 according to embodiments of the invention.

FIG. 8 is a flow diagram illustrating an example operation flow 800 of the slave 700 according to embodiments of the invention. Debug message packets can be addressed to specific slaves 700, or, in some cases, sent out generally for any slave to answer. The first bit of the debug message packet indicates whether the message is destined for a particular processor or is sent out to all slaves. Each slave 700 matches its own address to the data stored in its address register 712. In the embodiment described, each slave 700 does not know the address of any other slave.

In a process 810, the first slave 700 downstream of the master controller 612 of the debug system 600 inspects the global bit of the current debug packet. If the global bit is set and the slave 700 has a response that can be given in response to the global request, the process 800 exits the query 814 in the YES direction. Then, a process 820 de-asserts the global bit 820 and overwrites the address portion of the debug packet with its own address, so that no subsequent slave 700 can respond. Next, in a process 824, the slave 700 modifies the debug packet with the response data. The modification can be simply changing bits in the existing debug packet, or can involve appending data generated by the slave 700 to the end of the original debug packet as its response. After the modification to the current debug packet has been made, the process 800 transmits the debug packet to the next stage out on the debug channel.

If the global bit of the current debug packet is not set (or the slave 700 has no response to give to a global inquiry), the slave 700 reads the debug packet destination address in a process 830. If the current debug packet is not addressed to the particular slave 700 in inquiry 834, or if the slave does not have a response to the debug packet in inquiry 844, the slave simply sends the debug packet, with no modification, out onto the debug channel to the next slave 700.

If instead the current debug packet matches the local slave address 712 and the slave has a response in the inquiry 844, the flow 800 proceeds back to the process 824 to modify the debug packet with the appropriate response.

Once the slave 700 has completed the debug packet in the process, the flow 800 returns to the process 810 and the slave 700 waits to receive the next debug packet.

Figure 9:
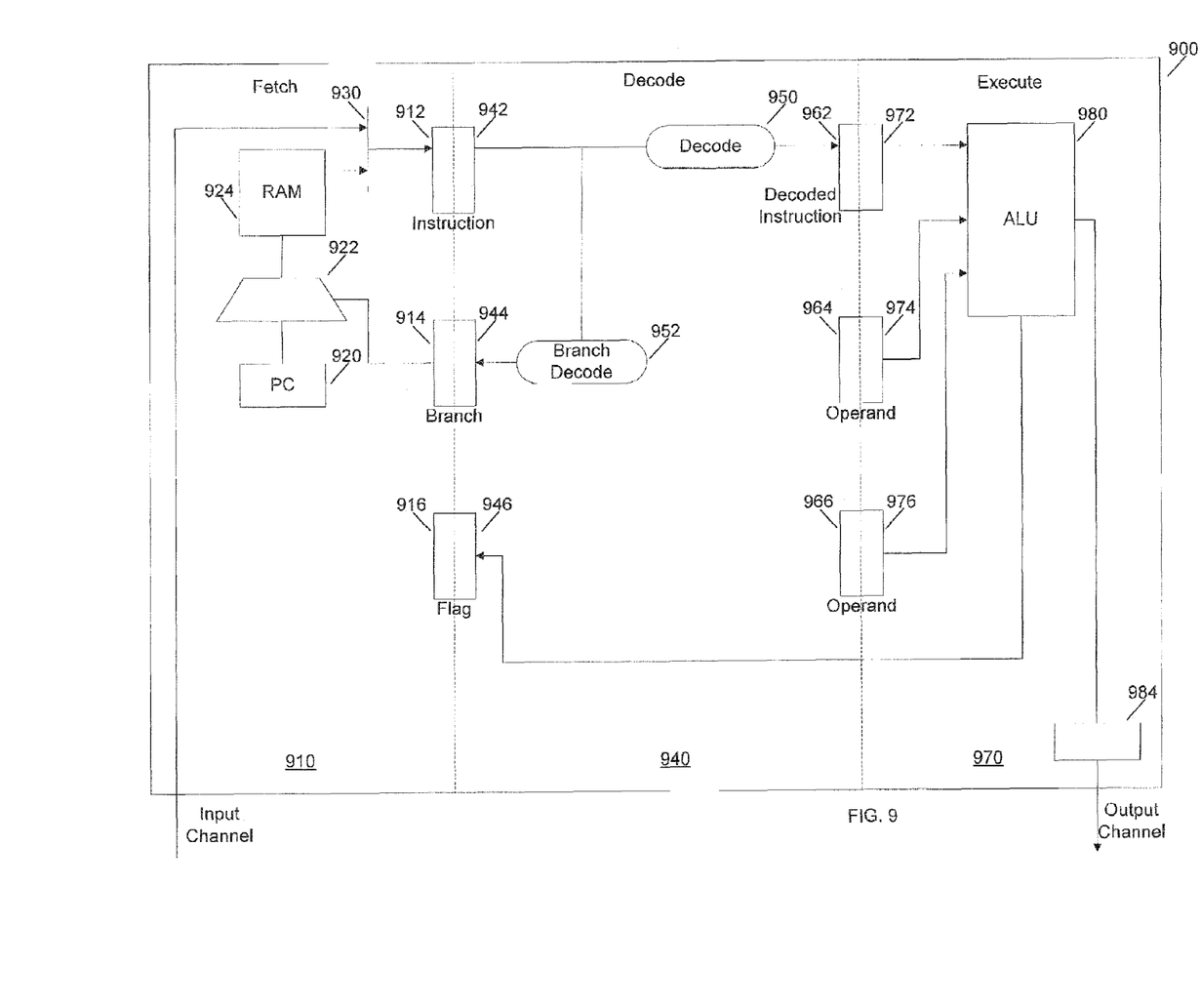
FIG. 9 is a functional block diagram of example pipeline stages in a processor of FIG. 5.

FIG. 9 illustrates how the debug slave 700 can dynamically change the operation of its host processor while the system 100 (FIG. 1) is in operation. FIG. 9 illustrates a typical operating flow in processors, such as the processor 500 of FIG. 5.

The operating flow of a processor 900 is divided into three main stages, a fetch stage 910, a decode stage 940, and an execute stage 970.

Between each stage is a set of data/protocol registers, such as the register 300 of FIG. 3. Each register 300 is a master-slave register and at any instant in time holds two (possibly different) values. The data width of the registers 300 can depend on their application. With reference to FIG. 9, an instruction register can be 16 or 32 bits wide, as can a branch register. A flag register can be as wide as necessary depending on the number of flags used for the particular processor. Because each register comprises two values, separate labels for each side of each register are illustrated in FIG. 9. For instance, the instruction register has a side that is in the fetch stage 910, referenced as register 912, and a side that is in the decode stage 940, referenced as register 942. Similar references are made to the branch and flag registers to denote which side is being referred to. Likewise, a decoded instruction register is 962/972, and two operand registers 964/974 and 966/976 are illustrated.

Feeding the instruction register 912 is a selector 930, which determines whether the processor is in memory execution mode or channel execution mode, as described above. The selector 930 receives its channel input from an input channel 902 and its memory input from RAM 924. Another selector 922 feeds the RAM 924 with the normal incrementing program counter 920 or one from a value generated by a branch decoder 952 in the decode branch 940. Also within the decode branch is a decoder 950, which may be identical to the decoder 510 of FIG. 5. In the execute stage 970, an ALU 980 receives instructions from the instruction register 972 and is connected to two operand registers 974, 976. The output of the ALU is fed to an output register 984, which further feeds the output channel 904.

In operation, the flow illustrated in FIG. 9 begins at the fetch stage, where an instruction is sent to the instruction register 912, either from the input channel 902 or from the RAM 924. Because the instruction register comprises two values, a first instruction is propagated from the instruction register 912 to the instruction register 942 when there is a valid instruction in the register 912 and the register 942 is accepting. Thus the instruction register 912/942 can be holding 0, 1, or 2 instructions. Further, if the instruction register 912/942 holds a single instruction, the instruction can be stored in either the instruction register 912 or 942. The ability to precisely control the location of instructions in the instruction register 912/942 allows for the debug network 600 to easily control the processor 900.

Such precise control could also be exercised on the border between the decode stage 940 and execute stage 970, but in this embodiment such fine control is typically unnecessary for operation of the debug network 600.

The debug network 600 can change the operation of the processor 900 under its control by extracting instructions from the instruction register 942 and writing new instructions into register 942. Recall in the description with reference to FIG. 7, that the slave 700 can remove instructions from, or can insert instructions into the instruction register 714 one bit at a time. The same is true for the instruction register 942 of FIG. 9. Similarly, the slave 700 can extract from and load to the previous result register 724. Although no analogue to the previous result register 724 is illustrated in FIG. 9, it would be located in the execute stage 970.

If such an extracted instruction is stored where it can be accessed by the debug network 600, such as in the debug system controller 610 (FIG. 6), the debug network could re-insert the extracted instruction back into the instruction register 942 when it concluded its operations. Thus, the debug network 600 is able to stop a processor from executing, store the processor's current state, execute its own instructions for testing/verifying/debugging and then, when the debug network has finished, replace the processor to its original state and re-start the processor.

Operation of the debug network 620 will now be described with reference to FIGS. 5-9.

A master controller 612 generates debug packets and places them on the debug datapath 622. The debug packets could be any length, but is convenient to make them equal the lowest common multiple of instruction width, 16-bits in this embodiment.

A debug packet is delimited by the packet_id of FIG. 3. In one embodiment, the packet_id is set to "1" for each bit in the debug packet except for the last bit. When a receiver detects the packet_id changing from "1" to "0", it knows it has received the last bit in the debug packet. Because debug packets are always received and sent on (sometimes with modifications), debug packets cannot ever become blocked because slaves are waiting. Keeping the debug channel free from blockage ensures that all packets can get access to the destination slave 620.

The debug packet includes a header, which identifies the packet as a global packet (which any slave 620 can answer) or includes a destination address for a particular slave. Other fields in the packet include a command field and an indication of how detailed of a response it is requesting. For example, the debug packet may instruct that the slave 620 simply acknowledge the receipt of the command. Alternatively, the slave 620 may be requested to append a result, copy status bits, or include other information. Additionally, the debug packet may include data, for example values to be loaded into specific registers of the processor. In most cases the packet requests data about the host processor of the slave 620, such as operating state, or the packet simply requests that the slave 620 acknowledge that it has received the command. In some embodiments, the global packet is limited only to particular debug commands.

All debug packets are returned by the slave 620 over the debug datapath 622 to the slave controller 614 for transfer to the debug system controller 610. In some embodiments, a slave cannot create a packet and can only modify the received packet. The slave 620 can append data by simply changing the packet_id of the former last bit of the current debug packet to "1," appending the data from the slave, and then inserting a "0" as the packet_id of the new last bit. When the slave controller 614 receives the new packet, it continues to process until it recognizes the 0 as the packet_id, thus operating on the whole length of the new packet.

Commands are broadly split into two groups: those that are guaranteed to produce a result (so long as the debug network 600 is operational), and those with contingent success. The guaranteed success actions include "watchdog," "slot", and "set-state."

The watchdog command from the debug network 600 is used in conjunction with a watchdog instruction executed by the processor. At any time a processor can execute a watchdog instruction, which sets to "1" the watchdog bit in the watchdog register 730 of its attached slave 700 (FIG. 7). At any time the debug controller system 610 (FIG. 6) can send a watchdog command to a specific processor by sending it in a debug packet. When responding to the command, a slave 700 reports the status of its watchdog bit in the watchdog register 730, and resets the bit value in the watchdog register 730 to "0."

The slot command from the debug network is used in conjunction with a trap instruction executed by the processor. The trap instruction stops the processor pipeline by not allowing the next instruction to execute. The processor on which the trap instruction just completed notifies its attached slave 700 that the trap has occurred, such as by sending an "except" signal. This causes the slave 700 to loads a trap ID into the exception information register 736 (FIG. 7). Then, when the debug system controller 610 issues a slot command, which may be a globally issued or directed to a specific slave 700, the slave appends the trap ID from register 736 in response to the request.

Channel exceptions follow the same pattern. A channel exception occurs when the processor decodes an instruction that is scheduled to receive data from, or output data to, a channel that is on an exception list stored by the processor. If such an exception occurs, similar to how traps are handled above, the processor notifies its slave 700, which causes the slave to store (in its exception register 736) the channel ID that caused the exception. If more than one channel could have caused the exception, only the highest priority channel ID is loaded into the exception register 736. Also similar to the procedure above, when the debug system controller 610 issues the slot command, the slave 700 answers by appending the exception ID from register 736 to the requesting debug packet.

The "set-state" command is used to set or clear the state of the information in the control register 732 (FIG. 7). Recall that the control register 732 stores states for "keep," "step," "execute," and "abort," which control operation of the slave 700, and thus the attached processor. The states may be set or cleared by sending appropriate debug commands, through the debug network 600 to the appropriate slave 700. There are also debug commands that may not be guaranteed to complete successfully, which include "load-previous," "extract," "insert," and "insert-execute."

With reference to FIG. 7, the load-previous command causes the slave 700 to load data from the debug channel into the previous result register 724. Recall that loading the previous result register occurs one bit at a time. Similarly, the insert command loads data from the debug channel into the instruction register 714. The insert-execute command first loads data from the debug channel into the instruction register 714, then causes the loaded instruction to execute. The extract command loads data from the instruction register 714 back onto the debug channel. None of the above commands are guaranteed to succeed because they depend on the state of the processor when the command is received and attempted.

During operation, the processor can be in one of several states. For example, the processor can be running, or it can be blocked. A block occurs when the protocol signals prevent data from being fetched, decoded, or executed (FIG. 9). For instance, if an object connected to the output channel 904 is not receiving data, the ALU 980 cannot process further data. If the ALU 980 cannot process data, then the instructions and operands fill the registers 962, 972, 964, 974, 966, and 976. This, in turn, causes the decode stage 940 to stall, which backs up instructions in the instruction register 912/942.

For effective debugging to occur, it is best to have the decode and execute stages 940, 970 empty (or know they will be empty), and an instruction held in the instruction register 942. This is denoted a "clean-halt" state, which means the processor 900 is ready to be controlled by the debug system 600. The instruction in the register 942 can be extracted by using the extract command, as described above. Also as described above, at the conclusion of the debugging, the previously extracted instruction can be replaced using the insert command, which would place the processor in the original state.

With reference to the control register 732 of FIG. 7, the Keep command halts the processor at the fetch stage and attempts to allow the processor to clear. The Step command allows one fetched instruction to decode and execute. The Execute command allows an inserted instruction to decode and execute, while the Abort input is used to nullify and remove results from the decode 940 and execute stages 970, thereby clearing the processor for operation. In the debug system, using the Abort command is usually a non-preferred choice because it removes data from a processor in an attempt to gain control when the processor is fatally blocked. By combining these commands, a rich dialog can be built between the debug master controller 612 (FIG. 6), the debug slave 620, and the processor attached to the slave.

In principle, the debug network 600 first uses Keep to stop the processor pipeline at the input of the decode stage 940 (FIG. 9), by de-asserting the valid signal to the instruction register 942. Instructions in the execute stage 970 are not affected and are completed normally. Operation of the fetch stage 910 will eventually stop because of de-asserted accept signals flowing back from the instruction register 942.

The debug network 600 can query the slave 700 to send the value of its status register 734, which indicates whether there is an instruction waiting and/or the execution is blocked, as described above.

Once the pipeline is put into a clean-halt state, instructions may be single stepped by executing then from the instruction register 942 one at a time using the Step control. The slave 700 could insert its own instruction into the instruction register 942, as described above, or can allow the instruction presently stopped in the register 942 to continue. If the slave 700 inserts its own instruction into the instruction register 942, the instruction stored in the instruction register 912 remains undisturbed.

After executing the desired instruction, the debug network 600 could request that the slave 700 send a copy of its status registers 734, which allows the debug system master 610 to determine how the processor is operating. Also the debug network 600 could request that the slave 700 send the previous result register 724. The system master 610 would need to recognize that the previous result register 724 is potentially invalid until the processor has completed a number of cycles because of the pipeline created by the execution logic.

The debug system master 610 can cause the processor to execute many different instructions by using the insert-execute command. When the system master 610 is ready to return the processor to the original instruction stream, it can put the saved instruction back into the instruction register 714, then cause it to execute, returning the processor back to its original condition before debug started.

If instead the processor is not in the clean-halt state, any attempt at executing the commands insert, insert-execute, and extract will be unsuccessful. The slave 700 indicates this by modifying a bit in the debug packet containing the instruction before sending it along the debug network to the debug system master 610.

From the foregoing it will be appreciated that, although specific embodiments of the invention have been described herein for purposes of illustration, various modifications may be made without deviating from the spirit and scope of the invention.

More specifically, the debug network could be implemented in a variety of ways. For example, a wider network could access data more quickly from the processors and would also allow instructions or data to be loaded with less delay. Multiple debug networks could be present on the platform. Instead of a ring, the network could be implemented by direct channels. Different data could be stored by the slave and requested by the debug master. Different commands could be used by the debug network to control the slaves and host processors.

Accordingly, the invention is not limited except as by the appended claims.

What is claimed is:

1. A debug system for processors in a multiprocessor system interconnected by a multi-node communication network, the system comprising:
    a debug network separate from the communication network, the debug network structured to operate regardless of a state of the processors; and
    a plurality of slave units coupled to the debug network, each of the plurality of slave units coupled to one of a respective plurality of processors in the multiprocessor system through a bi-directional information link and structured to retrieve information from and write data to its respective processor, at least one of the plurality of slave units structured to retrieve information from its respective processor while the respective processor is in operation, and also structured to retrieve information from its respective process while the respective processor is in a locked state because of a fault in execution.

2. A debug system according to claim 1 in which the at least one of the plurality of slave units is structured to retrieve information from its respective processor when the respective processor has already been stopped by its code.

3. A debug system according to claim 1, further comprising:
    one or more master units each structured to send a command in a message packet over the debug network to one of the slave units.

4. A debug system according to claim 3 in which the command is to retrieve an asynchronous indication of a status of the respective processor coupled to the one of the slave units without changing the execution of the respective processor.

5. A debug system according to claim 1 in which at least one slave is structured to respond to a command from the master unit by modifying data in the message packet.

6. A debug system according to claim 5 in which the at least one slave is structured to respond to a command from the master unit by appending data to the message packet.

7. A debug system according to claim 1 in which at least one of the slaves units is structured to control an action of the respective processor by writing a data value into a control register.

8. A debug system according to claim 1 in which the debug network is a loop.

9. A debug system for processors in a multiprocessor system interconnected by a multi-node communication network, the system comprising:
    a debug network separate from the communication network, the debug network structured to operate regardless of a state of the processors; and
    a plurality of slave units coupled to the debug network, each of the plurality of slave units coupled to one of a respective plurality of processors in the multiprocessor system and structured to retrieve information its respective processor;
    wherein at least one of the plurality of slave units is structured to halt its respective processor after receiving a command, and in which the at least one of the plurality of slave units is structured to retrieve an instruction from an instruction queue in the halted processor.

10. A debug system according to claim 9 in which the at least one slave unit is structured to halt its respective processor by invalidating an instruction.

11. A debug system according to claim 10 in which the command is to load an instruction into the halted processor.

12. A debug system according to claim 9 in which the command is to retrieve a status of a register holding a result of a previous instruction executed by the halted processor.

13. A debug system for processors in a multiprocessor system interconnected by a multi-node communication network, the system comprising:
  a debug network separate from the communication network, the debug network structured to operate regardless of a state of the processors;
  a plurality of slave units coupled to the debug network, each of the plurality of slave units coupled to one of a respective plurality of processors in the multiprocessor system and structured to retrieve information its respective processor; and
  one or more master units each structured to send a command in a message packet over the debug network to a specific one of the slave units.

14. A debug system according to claim 13 in which the specific one of the slave units is structured to send a response back to the master unit.

15. A debug system according to claim 13 in which the specific one of the slave units is structured to pass the message packet unmodified to the master unit if the specific slave unit cannot respond.

16. A debug system according to claim 13 in which the specific one of the slave units is structured to tag the message packet if the specific slave unit cannot respond.

17. A debug system according to claim 13 in which each message packet sent into the debug network exits the debug network.

18. A debug system according to claim 17 in which a message packet sent into the debug network and not modified by any of the plurality of slave units exits the debug network unmodified.

19. A debug system according to claim 17 in which each request to execute exits the debug network regardless of whether the slave unit can perform the instruction.

20. A debug system according to claim 13 in which each message packet is guaranteed to exit the debug network in a fixed time that is dependent on the number of slave units coupled to the debug network.

21. A debug system according to claim 13 in which each message packet exits the debug network in a fixed time that is independent of the running state of each of the respective processors connected to each slave unit on the debug network.

22. A method for debugging a processor in a multiprocessor system that is interconnected by a communication network, the method comprising:
  operating a debug network separate from the communication network, the debug network coupled to a plurality of slave units that are each coupled to a respective processor through a bi-directional link; and
  sending a command to one of the plurality of slave units to retrieve a status from its respective processor while the remaining processors in the multiprocessor system are operating without impact from the debug network.

23. A method according to claim 22, further comprising sending a second command to extract an instruction from its respective processor.

24. A method according to claim 22, further comprising sending a second command to extract an instruction from its respective processor while the processor is stopped.

25. A method according to claim 24 in which the stopped processor is stopped due to an instruction that was executed that causes the processor to stop.

26. A method according to claim 24 in which the stopped processor is stopped due to an execution fault in the processor.

27. A method according to claim 24 in which the stopped processor is stopped due to an action of the slave unit that is coupled to the stopped processor.

28. A method according to claim 22, further comprising sending a second command to insert an instruction into its respective processor while the processor is stopped.

29. A method according to claim 22, further comprising sending a second command to write data into a control register.

30. A method according to claim 22, further comprising sending a second command to extract a value from a previous result register.

31. A method according to claim 22, further comprising:
  receiving a response from the one of the plurality of slave units regardless of a state of its respective processor.

32. A method for debugging a processor in a multiprocessor system that is interconnected by a communication network, the method comprising:
  driving a plurality of slave units through nodes on a non-blocking network, each of the plurality of slave units connected to a respective processor in the multiprocessor system;
  sending a command to one of the plurality of slave units in a message packet sent over the non-blocking network; and
  in the one of the plurality of slaves, modifying the message packet.

33. A method according to claim 32, further comprising, in the one of the plurality of slaves, modifying the message packet by appending data to the message packet.

34. A method according to claim 33 in which the appended data includes information about the respective processor.

* * * * *